(12) United States Patent
Jeong

(10) Patent No.: US 9,923,156 B2
(45) Date of Patent: Mar. 20, 2018

(54) FOLDABLE DISPLAY APPARATUS

(71) Applicant: SAMSUNG DISPLAY CO., LTD., Yongin-si, Gyeonggi-do (KR)

(72) Inventor: Gyeongho Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/981,493

(22) Filed: Dec. 28, 2015

(65) Prior Publication Data

US 2017/0025634 A1    Jan. 26, 2017

(30) Foreign Application Priority Data

Jul. 23, 2015  (KR) .................. 10-2015-0104361

(51) Int. Cl.
*H01L 51/00* (2006.01)
*G06F 1/16* (2006.01)
*H01L 51/52* (2006.01)

(52) U.S. Cl.
CPC ........ *H01L 51/0097* (2013.01); *G06F 1/1652* (2013.01); *G06F 2203/04102* (2013.01); *H01L 51/5237* (2013.01)

(58) Field of Classification Search
CPC ......... G06F 3/0412; G06F 2203/04102; G06F 1/1652; H01L 27/323; H01L 51/0097; H01L 51/5237; H01L 51/5281; H01L 27/3244; H01L 2251/5338; H01L 51/5253; G02F 1/13452; G02F 1/1333; G02F 1/133305; H05K 3/361; H05K 3/323; H05K 1/147; H05K 1/028; H05K 1/0296; H05K 3/0014; H05K 3/28; B05D 3/002; H04M 1/0268
See application file for complete search history.

(56) References Cited

U.S. PATENT DOCUMENTS

| | | | |
|---|---|---|---|
| 2009/0021666 A1* | 1/2009 | Chen | G02F 1/133305 |
| | | | 349/58 |
| 2012/0305342 A1 | 12/2012 | Yuasa | |
| 2014/0131668 A1 | 5/2014 | Kim | |
| 2014/0374704 A1* | 12/2014 | Jang | H01L 51/0097 |
| | | | 257/40 |
| 2015/0091012 A1 | 4/2015 | Namkung et al. | |

(Continued)

FOREIGN PATENT DOCUMENTS

| | | |
|---|---|---|
| KR | 10-2008-0035709 A | 4/2008 |
| KR | 10-2012-0115364 A | 10/2012 |
| KR | 10-1329946 B1 | 11/2013 |

(Continued)

*Primary Examiner* — Daniel Luke
*Assistant Examiner* — Khatib Rahman
(74) *Attorney, Agent, or Firm* — Lewis Roca Rothgerber Christie LLP

(57) ABSTRACT

A foldable display apparatus includes a flexible display panel that is foldable, and a case configured to support the flexible display panel, wherein the flexible display panel includes a first protective film at a first region corresponding to an out-folding portion, and a second protective film at a second region corresponding to an in-folding portion, wherein the in-folding portion and the out-folding portion have opposite directions of curvature, and wherein the first and second protective films include different materials.

13 Claims, 3 Drawing Sheets

(56) References Cited

U.S. PATENT DOCUMENTS

2015/0351232 A1* 12/2015 Cok ................. H05K 1/028
                                                          156/204
2016/0105950 A1*  4/2016 Drzaic ............... B05D 3/002
                                                          174/251

FOREIGN PATENT DOCUMENTS

KR    10-2014-0060776 A    5/2014
KR    10-2015-0038819 A    4/2015

* cited by examiner

FOLDABLE DISPLAY APPARATUS

CROSS-REFERENCE TO RELATED APPLICATION

This application claims the benefit of Korean Patent Application No. 10-2015-0104361, filed on Jul. 23, 2015, in the Korean Intellectual Property Office, the disclosure of which is incorporated herein in its entirety by reference.

BACKGROUND

1. Field

One or more exemplary embodiments relate to a foldable display apparatus that has a main body that may fold or unfold.

2. Description of the Related Art

A flat panel display apparatus, for example, an organic light-emitting display apparatus, may have a characteristic of being flexibly transformed, and accordingly, may have a foldable structure for the convenience of carrying the flat panel display apparatus.

SUMMARY

One or more exemplary embodiments include a foldable display apparatus.

Additional aspects will be set forth in part in the description that follows and, in part, will be apparent from the description, or may be learned by practice of the presented embodiments.

According to one or more exemplary embodiments, a foldable display apparatus includes a flexible display panel that is foldable, and a case configured to support the flexible display panel, wherein the flexible display panel includes a first protective film at a first region corresponding to an out-folding portion, and a second protective film at a second region corresponding to an in-folding portion, wherein the in-folding portion and the out-folding portion have opposite directions of curvature, and wherein the first and second protective films include different materials.

Compressive stress may be applied to the first protective film during folding of the out-folding portion, and tensile stress may be applied to the second protective film during folding of the in-folding portion.

The material of the first protective film may be more rigid than the material of the second protective film.

The first protective film may include a metal film.

An elastic coefficient of the metal film may be about 10 Gpa or greater.

The second protective film may include a polymer film.

The first region may further correspond to an entirety of the flexible display panel with an exception of an area corresponding to the in-folding portion, and the second region may be surrounded by the first region.

The second region may further correspond to an entirety of the flexible display panel with an exception of an area corresponding to the out-folding portion, and the first region may be surrounded by the second region.

The first protective film and the second protective film may be on a rear surface of the flexible display panel that is opposite to a front surface that is configured to display images.

The flexible display panel may include a display layer configured to display images, and a window on the front surface, and the display layer may be between the window and the first and second protective films.

The foldable display may further include a touch screen panel and a polarization layer between the display layer and the window.

The foldable display apparatus may further include adhesive layers respectively between adjacent ones of layers of the flexible display panel, the layers of the flexible display panel including a layer including the first protective film and the second protective film, the display layer, the touch screen panel, the polarization layer, and the window.

The case may include a first case, a second case, and a third case that are rotatably connected in series.

The first case and the second case may rotate in a direction corresponding to the out-folding portion of the flexible display panel, and the second case and the third case may rotate in a direction corresponding to the in-folding portion of the flexible display panel.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
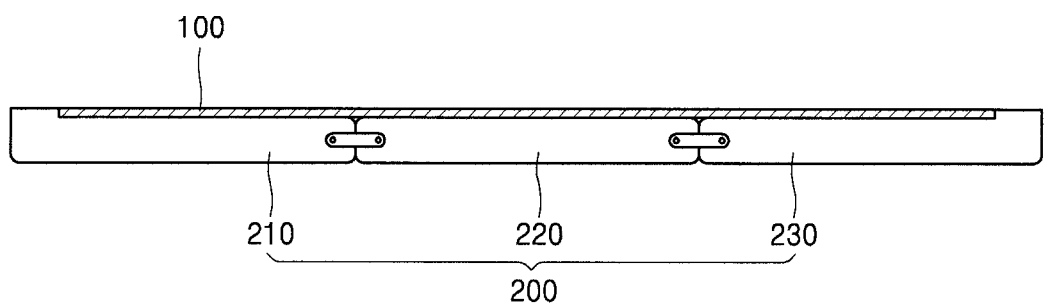
FIG. 1 is a diagram showing an unfolded state of a foldable display apparatus according to an exemplary embodiment.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
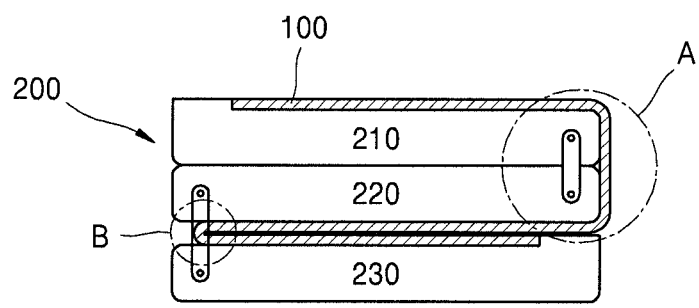
FIG. 2 is a diagram showing a folded state of the foldable display apparatus of FIG. 1.

FIGS. 1 and 2 respectively show an unfolded state and a folded state of a foldable display apparatus according to an exemplary embodiment.

The foldable display apparatus includes a flexible display panel 100 that may be flexibly curved. The flexible display panel 100 generally includes a stack structure as a display layer 120 (see FIG. 3), wherein the stack structure includes a thin film transistor and a light-emitting device for forming images, and an encapsulation layer for protecting the thin film transistor and the light-emitting device stacked on a flexible substrate. Because a flexible substrate is used instead of a rigid glass substrate, the flexible display panel 100 may be freely folded and unfolded within an allowable range of flexibility. Therefore, the flexible display panel 100 may be folded into an S-shape, as shown in FIG. 2, in a folded state.

The flexible display panel 100 is supported to be folded and unfolded by a case 200 including a first case 210, a second case 220, and a third case 230. That is, the flexible display panel 100 is supported by the first, second, and third cases 210, 220, and 230 that are connected in series. In addition, because the first case 210 and the second case 220, and the second case 220 and the third case 230, are respectively rotatably connected to each other, the flexible display panel 100 may be folded or unfolded by rotations of the first, second, and third cases 210, 220, and 230. Here, in FIG. 1, between two opposite surfaces of the flexible display panel 100, an upper surface, that is, a surface on which a user may view images, is referred to as a front surface, and a surface that is opposite to the upper surface, that is, a lower surface facing the first, second, and third cases 210, 220, and 230, is referred to as a rear surface.

The first, second, and third cases 210, 220, and 230 are rotated when the flexible display panel 100 is folded such that the flexible display panel 100 may be curved in an S-shape, and accordingly, the flexible display panel 100 may have an out-folding portion A and an in-folding portion B.

The out-folding portion A is a portion where the flexible display panel 100 is folded and the front surface thereof is exposed to the outside, and the in-folding portion B is a portion where the flexible display panel 100 is folded and the front surface is hidden in the case 200. That is, when the flexible display panel 100 is folded, the first case 210 and the second case 220 are rotated so that the out-folding portion A is formed, and the second case 220 and the third case 230 are rotated so that the in-folding portion B is formed.

However, stress is applied to the out-folding portion A and to the in-folding portion B in opposite directions to each other. That is, based on the rear surface of the flexible display panel 100, compressive stress is applied adjacent the out-folding portion A, and tensile stress is applied adjacent the in-folding portion B. Because the stresses are applied in opposite directions, as described above, isolation of a protective film 110 may occur unless the protective film 110 (see FIG. 3) on the rear surface of the flexible display panel 100 is appropriately disposed. That is, because the tensile stress is applied adjacent the in-folding portion B, the protective film 110 may include a soft material having excellent elongation, and because the compressive stress is applied adjacent the out-folding portion A, the protective film 110 may include a high modulus material having an excellent elastic coefficient. If the protective film 110 including a soft material is used as an entirety of the flexible display panel 100, the protective film 110 may not partially adhere to a main body, but instead may crumple (i.e., a so-called buckling phenomenon may occur) on the out-folding portion A to which the compressive stress is applied. On the contrary, if the protective film 110 including a high modulus material is used as an entirety of the flexible display panel 100, a repulsive force against the tension becomes too strong on the in-folding portion B, and accordingly, it may be difficult to fold the flexible display panel 100 on the in-folding portion B.

Figure 3:
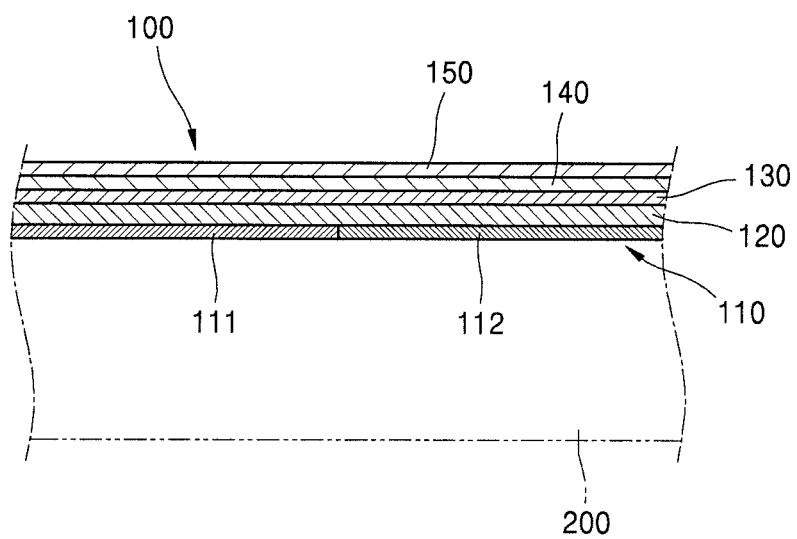
FIG. 3 is a cross-sectional view schematically showing a stack structure of a flexible display panel including a protective film in the foldable display apparatus of FIG. 1.

Therefore, to address the above problem, a first protective film 111 and a second protective film 112 including different materials may be attached to separate regions on the rear surface of the flexible display panel 100, as shown in FIG. 3.

As shown in FIG. 3, the flexible display panel 100 includes a display layer 120 for emitting images, and the first and second protective films 111 and 112 are attached to a rear surface of the display layer 120. In addition, a touch screen panel 130, a polarization layer 140, and a window 150 are sequentially stacked on a front surface of the display layer 120. An adhesive layer may be disposed between adjacent layers.

Figure 7:
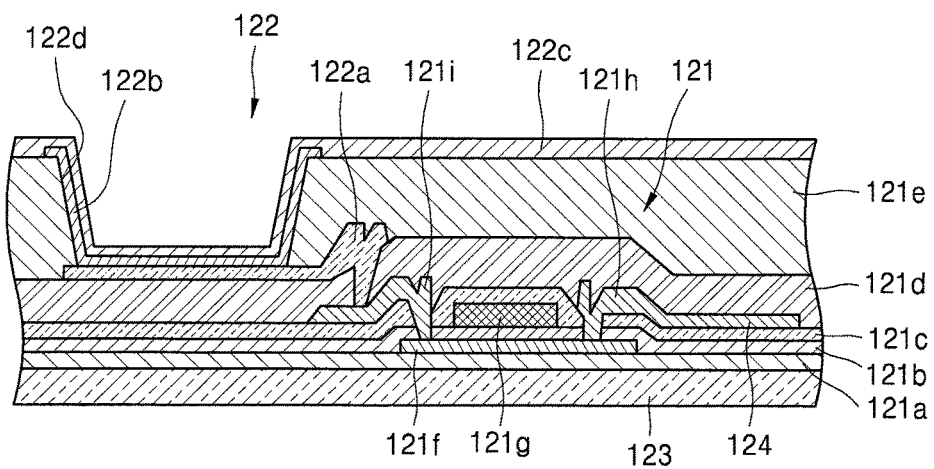
FIG. 7 is a diagram showing a detailed structure of a display layer in the flexible display panel of FIG. 3.

Relations between the first and second protective films 111 and 112 and the out-folding portion A and the in-folding portion B, and folding and unfolding operations will be described later. First, an internal structure of the display layer 120 of the flexible display panel 100 that is foldable will be described briefly below. The display layer 120 may have a structure, for example, shown in FIG. 7. That is, the display layer 120 may include a thin film transistor 121 and an organic light-emitting diode 122, and an emission layer 122b, which is vulnerable especially to exposure to gas, is disposed in the organic light-emitting diode 122. In more detail, an active layer 121f is disposed on a buffer layer 121a that is adjacent a flexible substrate 123, and the active layer 121f includes source and drain regions on which N-type and P-type impurities are doped to a high concentration. The active layer 121f may include an oxide semiconductor. For example, the oxide semiconductor may include an oxide material of a material selected from XII, XIII, or XIV-group metal elements, such as zinc (Zn), indium (In), gallium (Ga), Tin (Sn), cadmium (Cd), germanium (Ge), or hafnium (Hf), and combinations thereof. For example, the active layer 121f may include G-I-Z-O[$(In_2O_3)a(Ga_2O_3)b(ZnO)c$] (here, a, b, and c are real numbers respectively satisfying conditions of a≥0, b≤0, and c>0). A gate electrode 121g is formed on the active layer 121f with a gate insulating layer 121b therebetween. A source electrode 121h and a drain electrode 121i are formed on the gate electrode 121g. An interlayer insulating layer 121c is disposed between the gate electrode 121g and the source and drain electrodes 121h and 121i. A passivation layer 121d is disposed between the source and drain electrodes 121h and 121i and an anode electrode 122a of the organic light-emitting diode 122.

An insulating planarization layer 121e, which may include acryl, etc., is formed on the anode electrode 122a. An opening 122d is formed in the planarization layer 121e, and then, the organic light-emitting diode 122 is formed.

The organic light-emitting diode 122 emits red, green, and/or blue light to display image information, and includes the anode electrode 122a connected to the drain electrode 121i of the thin film transistor 121 to receive a positive voltage therefrom, a cathode electrode 122c covering all pixels for supplying a negative voltage, and the emission layer 122b between the anode and cathode electrodes 122a and 122c to emit light.

A hole injection layer (HIL), a hole transport layer (HTL), an electron transport layer (ETL), an electron injection layer (EIL), etc. may be stacked adjacent the emission layer 122b.

The emission layer 122b may be formed on each of the separate pixels so that the pixels emitting red, green, and/or blue light may collectively form one unit pixel. Otherwise, the emission layer 122b may be commonly disposed throughout the entire pixel area regardless of locations of the pixels. Here, the emission layer 122b may be configured by vertically stacking layers respectively including emission materials emitting, for example, red, green, and/or blue light, or by mixing the emission materials. Light of other colors are also combined provided that white light may be emitted via the combinations. In addition, the emission layer 122b may further include a color conversion layer or a color filter for converting white light into color light corresponding to the color of the color conversion layer or of the color filter.

In addition, a thin film encapsulation layer, in which an organic layer and an inorganic layer are alternately stacked, may be disposed on the cathode electrode 122c.

Because the flexible display panel 100 having the display layer 120 of the above-described structure may be flexibly transformed, the flexible display panel 100 may be folded or unfolded according to the folding and unfolding operations of the case 200.

Figure 4:
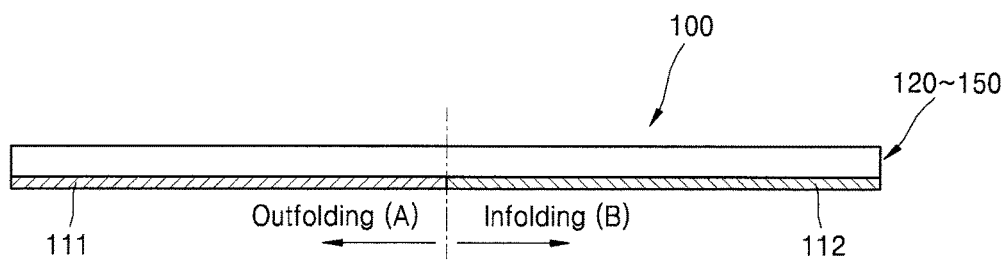
FIG. 4 is a diagram showing an unfolded state of the flexible display panel of FIG. 3.
Figure 5:
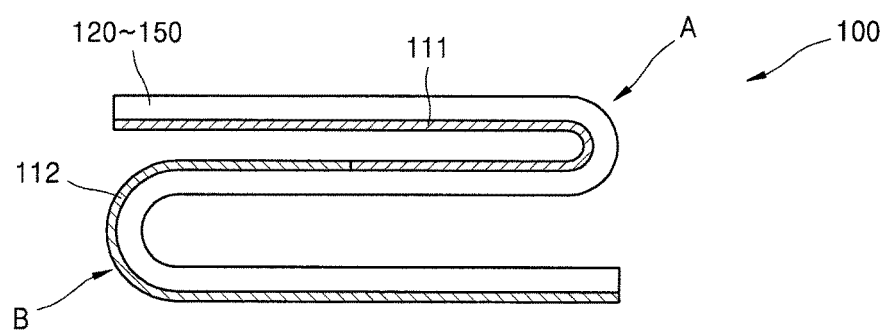
FIG. 5 is a diagram showing a folded state of the flexible display panel of FIG. 3.

The flexible display panel 100 of the foldable display apparatus may be unfolded, as shown in FIG. 4, during unfolding of the foldable display apparatus, and may be folded in an S-shape, as shown in FIG. 5, during folding of the foldable display apparatus. In addition, the first and second protective films 111 and 112 are attached to the flexible display panel 100 to respectively cover regions including the out-folding portion A and the in-folding portion B.

That is, as shown in FIG. 4, the entire rear surface of the flexible display panel 100 is divided into halves, and then, the first protective film 111 is attached to a region including the out-folding portion A, and the second protective film 112 is attached to the other region including the in-folding portion B.

In the above state, when the foldable display apparatus is folded as shown in FIG. 2, the flexible display panel 100 ends up having the out-folding portion A and the in-folding portion B, as shown in FIG. 5, and the first protective film 111 is attached to the out-folding portion A, while the second protective film 112 is attached to the in-folding portion B.

Because the first protective film 111 (which is attached to the out-folding portion A, to which the compressive stress is applied) needs to have high rigidity, the first protective film 111 may include a highly rigid material, such as a metal film having an elastic coefficient of about 10 Gpa or greater.

On the contrary, because the second protective film 112 (which is attached to the in-folding portion B, to which the tensile stress is applied) needs to have flexibility, the second protective film 112 may include a soft material, such as a polymer film.

As such, the first and second protective films 111 and 112, which have different materials from each other, are respectively attached to the out-folding portion A and the in-folding portion B so as to protect the out-folding portion A and the in-folding portion B appropriately, and thus, a possibility of generating buckling on the out-folding portion A may be reduced, and a repulsive force against the folding on the in-folding portion B may be reduced or prevented.

The foldable display apparatus having the above-described structure may be used as follows.

When a user wants to view images in a state in which the foldable display apparatus is unfolded to be flat, the first, second, and third cases 210, 220, and 230 are spread to be collectively straight to make the foldable display apparatus unfolded, as shown in FIG. 1. Therefore, the user may view flat images on the front surface of the flexible display panel 100 in the unfolded state.

In addition, when the user stores or carries the foldable display apparatus, the case 200 is folded, as shown in FIG. 2, and accordingly, the flexible display panel 100 is folded in an S-shape including the out-folding portion A and the in-folding portion B. Here, the first protective film 111 that is highly rigid is attached to the out-folding portion A on the rear surface of the flexible display panel 100 so as to prevent the buckling phenomenon, and the second protective film 112 is attached to the in-folding portion B on the rear surface of the flexible display panel 100 to reduce the repulsive force against the folding operation.

Therefore, the buckling of the protective film, or the excessive repulsive force against the folding thereof, may be effectively reduced or prevented in the complex folding structure having the out-folding portion A and the in-folding portion B.

Figure 6A:
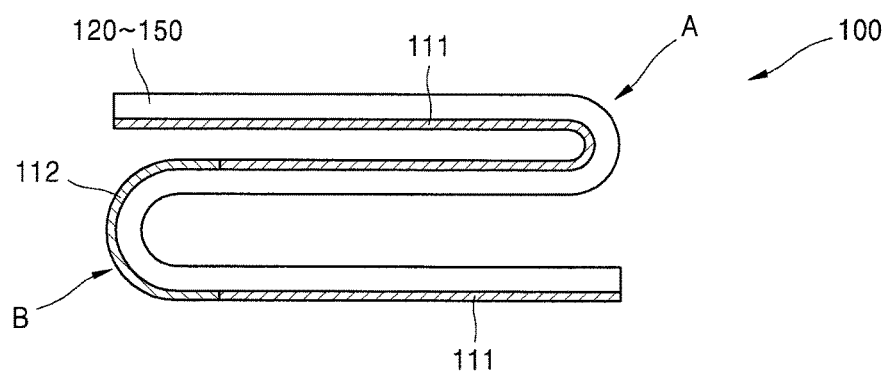
FIGS. 6A and 6B are diagrams showing modified examples of the protective film of FIG. 3.

In the present exemplary embodiment, the first protective film 111 and the second protective film 112 respectively cover the halves on the rear surface of the flexible display panel 100. However, in other embodiments, as shown in FIG. 6A, the first protective film 111 that is highly rigid may be attached to an entirety of the rear surface of the flexible display panel 100, with the exception of the in-folding portion B, on which the second protective film 112 is attached.

Figure 6B:
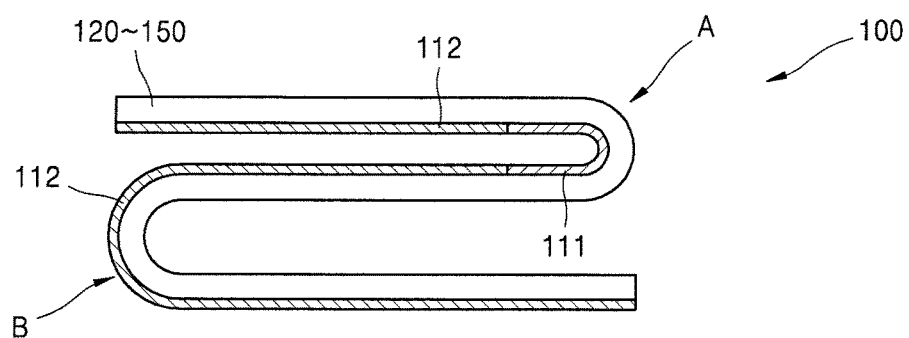

Alternatively, as shown in FIG. 6B, the second protective film 112 that is highly flexible may be attached to an entirety of the rear surface of the flexible display panel 100, with the exception of the out-folding portion A, on which the first protective film 111 is attached.

That is, division of the first region, on which the first protective film 111 is attached, and the second region, on which the second protective film 112 is attached, is not limited, provided that the first protective film 111 is attached to the out-folding portion A, and that the second protective film 112 is attached to the in-folding portion B.

Therefore, the foldable display apparatus according to the exemplary embodiments may prevent isolation of the protective film from the folded portion of the flexible display panel, and accordingly, products of stabilized quality may be obtained.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims and their equivalents.

What is claimed is:

1. A foldable display apparatus comprising:
a flexible display panel that is foldable; and
a case configured to support the flexible display panel,
wherein the flexible display panel comprises:
    a first protective film at a first region corresponding to an out-folding portion; and
    a second protective film at a second region corresponding to an in-folding portion,
wherein the in-folding portion and the out-folding portion have opposite directions of curvature,
wherein the first and second protective films comprise different materials, and collectively cover a rear surface of the flexible display panel, and
wherein the material of the first protective film that is different from the material of the second protective film is more rigid than the material of the second protective film and covers an entirety of the rear surface at the out-folding portion.

2. The foldable display apparatus of claim 1, wherein compressive stress is applied to the first protective film during folding of the out-folding portion, and
wherein tensile stress is applied to the second protective film during folding of the in-folding portion.

3. The foldable display apparatus of claim 1, wherein the first protective film comprises a metal film.

4. The foldable display apparatus of claim 3, wherein an elastic coefficient of the metal film is about 10 Gpa or greater.

5. The foldable display apparatus of claim 1, wherein the second protective film comprises a polymer film.

6. A foldable display apparatus comprising:
a flexible display panel that is foldable; and
a case configured to support the flexible display panel, wherein the flexible display panel comprises:
  a first protective film at a first region corresponding to an out-folding portion; and
  a second protective film at a second region corresponding to an in-folding portion,
wherein the in-folding portion and the out-folding portion have opposite directions of curvature,
wherein the first and second protective films comprise different materials,
wherein the first region further corresponds to an entirety of the flexible display panel with an exception of an area corresponding to the in-folding portion, and
wherein the second region is surrounded by the first region.

7. A foldable display apparatus comprising:
a flexible display panel that is foldable; and
a case configured to support the flexible display panel,
wherein the flexible display panel comprises:
  a first protective film at a first region corresponding to an out-folding portion; and
  a second protective film at a second region corresponding to an in-folding portion,
wherein the in-folding portion and the out-folding portion have opposite directions of curvature,
wherein the first and second protective films comprise different materials,
wherein the second region further corresponds to an entirety of the flexible display panel with an exception of an area corresponding to the out-folding portion, and
wherein the first region is surrounded by the second region.

8. The foldable display apparatus of claim 1, wherein the first protective film and the second protective film are on the rear surface of the flexible display panel that is opposite to a front surface that is configured to display images.

9. The foldable display apparatus of claim 8, wherein the flexible display panel comprises:
  a display layer configured to display images; and
  a window on the front surface, and
  wherein the display layer is between the window and the first and second protective films.

10. The foldable display apparatus of claim 9, further comprising a touch screen panel and a polarization layer between the display layer and the window.

11. A foldable display apparatus comprising:
a flexible display panel that is foldable; and
a case configured to support the flexible display panel,
wherein the flexible display panel comprises:
  a first protective film at a first region corresponding to an out-folding portion;
  a second protective film at a second region corresponding to an in-folding portion;
wherein the in-folding portion and the out-folding portion have opposite directions of curvature, and
wherein the first and second protective films comprise different materials, and collectively cover a rear surface of the flexible display panel,
wherein the first protective film and the second protective film are on the rear surface of the flexible display panel that is opposite to a front surface that is configured to display images,
wherein the flexible display panel further comprises:
  a display layer configured to display images; and
  a window on the front surface, and
  wherein the display layer is between the window and the first and second protective films,
wherein the foldable display apparatus further comprises a touch screen panel and a polarization layer between the display layer and the window, and adhesive layers respectively between adjacent ones of layers of the flexible display panel, the layers of the flexible display panel comprising:
  a layer comprising the first protective film and the second protective film;
  the display layer;
  the touch screen panel;
  the polarization layer; and
  the window.

12. The foldable display apparatus of claim 1, wherein the case comprises a first case, a second case, and a third case that are rotatably connected in series.

13. The foldable display apparatus of claim 12, wherein the first case and the second case rotate in a direction corresponding to the out-folding portion of the flexible display panel, and
  wherein the second case and the third case rotate in a direction corresponding to the in-folding portion of the flexible display panel.

* * * * *